(12) United States Patent
Hung et al.

(10) Patent No.: US 7,023,272 B2
(45) Date of Patent: Apr. 4, 2006

(54) MULTI-BAND LOW NOISE AMPLIFIER SYSTEM

(75) Inventors: Chih-Ming Hung, Mckinney, TX (US); Dirk Leipold, Plano, TX (US); Yo-Chuol Ho, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 83 days.

(21) Appl. No.: 10/827,577

(22) Filed: Apr. 19, 2004

(65) Prior Publication Data

US 2005/0231290 A1    Oct. 20, 2005

(51) Int. Cl.
*H03F 3/68* (2006.01)
(52) U.S. Cl. ...................... 330/126; 330/311
(58) Field of Classification Search ............... 330/126
See application file for complete search history.

(56) References Cited

U.S. PATENT DOCUMENTS

| | | | |
|---|---|---|---|
| 5,880,634 A * | 3/1999 | Babanezhad | 330/126 |
| 6,674,337 B1 * | 1/2004 | Hashemi et al. | 333/32 |
| 6,838,944 B1 * | 1/2005 | Franca-Neto | 330/305 |
| 2003/0112076 A1 * | 6/2003 | Wang | 330/295 |

OTHER PUBLICATIONS

"A Low-Noise Amplifier For A Multi-Band and Multi-Mode Handset", Chang-Soek Lee, et al., 1998 IEEE Radio Frequency Integrated Circuits Symposium, Jun. 1998, pp. 47-50.

"A Merged Structure of LNA & Sub-Harmonic Mixer for Multi-band DCR Applications", Kwang-Jin Koh, et al., 2003 IEEE MTT-S International Microwave Symposium Digest, V. 1, Jun. 2003, pp. 243-246.

"A Pseudo-Concurrent 0.18 μm Multi-Band CMOS LNA", Seyed Hossein Miri Lavasani (SM) et al., IEEE MTT-S International Microwave Symposium Digest, V. 1, Jun. 2003, pp. A181-A184.

"Demonstration of a Switched Resonator Concept in a Dual-Band Monolithic CMOS LC-Tuned VCO", Seong-Mo Yim, et al., IEEE Conference of Custom Integrated Circuits, May 2001, pp. 205-208.

* cited by examiner

*Primary Examiner*—Robert Pascal
*Assistant Examiner*—Krista M. Flanagan
(74) *Attorney, Agent, or Firm*—Ronald O. Neerings; Wade James Brady, III; Frederick J. Telecky, Jr.

(57) ABSTRACT

A low noise amplifier (LNA) operates over multiple frequency bands while occupying less silicon area than known LNA implementations. The LNA includes output matching that can be tuned by an adjustable inductor together with a tunable capacitor bank.

21 Claims, 3 Drawing Sheets

MULTI-BAND LOW NOISE AMPLIFIER SYSTEM

BACKGROUND OF THE INVENTION

1. Field of the Invention

This invention relates generally to integrated circuits, and more particularly to a system and method for implementing a low noise amplifier (LNA) that operates over multiple frequency bands while occupying less silicon area than known LNA implementations.

2. Description of the Prior Art

Single integrated circuit chips required to support multiple radio standards one at a time have typically done so with multiple circuit blocks/modules in the IC in which each block/module has accommodated only a single radio standard. Enhanced Data Rates for GSM (EDGE) and General Packet Radio Services (GPRS) have traditionally been designed using three or four Low-Noise Amplifiers (LNAs) cascading with the same number of mixers in which the outputs are merged together feeding a single IF/baseband circuit. Such traditional approaches are disadvantageous in that 1) a huge semiconductor area is required by multiple LNAs and mixers, and 2) long interconnect routings over a large area are needed but maintaining a low signal loss, low parasitic resistance and low parasitic capacitance for such routings is very difficult to achieve. As CMOS technology continues to scale down, the silicon cost per square millimeter ($mm^2$) increases dramatically; and the metal interconnect quality becomes significantly worse such that metal routing across a large area becomes a major concern. It is desirable therefore to have fewer LNAs on a single chip while still being able to support multiple radio standards.

Significant research continues in the area of multi-band LNAs. One multi-band architecture 100 disclosed by Lavasani, S. H. M., Chaudhuri, B. and Kiaei, S., "A pseudo-concurrent 0.18 μm multi-band CMOS LNA," *IEEE MTT-S International Microwave Symposium Digest*, v. 1, pp. A181–A184, June 2003, Kwang-Jin Koh, Mun-Yang Park, Yong-Sik Youn, Seon-Ho Han, Jang-Hong Choi, Cheon-Soo Kim, Sung-Do Kim and Hyun-Kyu Yu, "A merged structure of LNA & sub-harmonic mixer for multi-band DCR applications," *IEEE MTTS-S International Microwave Symposium Digest*, v. 1, pp. 243–246, June 2003, and Chang-Soek Lee, Min-Gun Kim, Joe-Jin Lee, Kwang-Eui Pyun and Hyung-Moo Park, "A low noise amplifier for a multi-band and multi-mode handset," *IEEE Radio Frequency Integrated Circuits* (RFIC) *Symposium*, pp. 47–50, June 1998, is shown in FIG. 1(*a*) that illustrates a single IC input and broadband matching at the input and output. Another multi-band architecture 200 that uses multiple input transistors is shown in FIG. 1(*b*). One technique using multiple input matching networks on a printed circuit board (PCB) was proposed by Lavasani, S. H. M., Chaudhuri, B. and Kiaei, S., "A pseudo-concurrent 0.18 μm multi-band CMOS LNA," *IEEE MTT-S International Microwave Symposium Digest*, v. 1, pp. A181–A184, June 2003. The foregoing techniques are disadvantageous in that 1) they need external switches to select between different matching networks, thus increasing insertion loss and noise figure (NF); 2) they have inferior filtering/rejection to interferers due to either broadband matching or multiple resonant frequencies of the matching networks, thus increasing the LNA linearity requirement; 3) they have inferior isolation between multiple input signals because there is only one input node to the LAN, particularly if the frequencies of the multiple radio standards are not distant; 4) there is not an antenna filter available in the present market to support multiple frequency bands; and 5) although for systems such as GPRS and EDGE, there is only one frequency band that needs to be active at any time on the IC, the filters on the PCB cannot be turned off, resulting in large interference from the inactive to the active frequency bands.

In view of the foregoing, it is highly desirable and advantageous to provide a system and method that employs fewer LNAs on a single chip than that employed using known techniques, but that is still able to support multiple radio standards.

SUMMARY OF THE INVENTION

The present invention is directed to a system and method for implementing a low noise amplifier (LNA) that operates over multiple frequency bands while occupying less silicon area than known LNA implementations. The LNA includes output matching that can be tuned by an adjustable inductor together with a tunable capacitor bank. The adjustable inductor can be implemented in various ways such by using the technique disclosed by Seong-Mo Yim and Kenneth, K. O., "Demonstration of a switched resonator concept in a dual-band monolithic CMOS LC-tuned VCO," *IEEE Conference of Custom Integrated Circuits*, pp. 205–208, May 2001, of using a switch to short a section of the inductor metal winding, or by using a magnetic coupling to increase/decrease the effective inductance, or by using a combination of the two approaches. The LNA topology can be easily extended to a differential LNA and requires no external switches, thus eliminating the additional insertion loss and noise figure. The LNA topology further preserves the filtering/rejection to interferers associated with more conventional LNAs, relaxing LNA linearity requirements. Superior isolation is achieved between multiple input signals while allowing use of antenna filters available in the market to reduce overall cost. All desired frequency bands are accommodated on the PCB during the ON state.

According to one embodiment, a low noise amplifier (LNA) comprises:

a plurality of DC biasing circuits, each DC biasing circuit operational to provide a DC bias source for a single RF input stage and to increase isolation from other input stages;

a cascade of radio frequency (RF) input stages, wherein each RF input stage includes a passively tuned RF input circuit biased via a single DC biasing circuit selected from within the plurality of DC biasing circuits; and a sole RF output node associated with the cascade of RF input stages and the plurality of DC biasing circuits, wherein the LNA operates over multiple frequency bands without use of external switches.

According to another embodiment, a low noise amplifier (LNA) comprises:

means for filtering a plurality of radio frequency (RF) input signals; and means for tuning the plurality of filtered RF input signals at a sole common RF output node such that the LNA operates over multiple frequency bands without use of external input switches and further without use of external output switches.

According to yet another embodiment of the present invention, a low noise amplifier (LNA) comprises a sole tunable RF output stage including at least one adjustable inductor, wherein the sole tunable RF output stage operates via the at least one adjustable inductor to tune filtered RF input signals such that the LNA operates over multiple frequency bands without use of external input switches and further without use of external output switches.

According to still another embodiment of the present invention, a low noise amplifier (LNA) comprises:

a plurality of DC biasing circuits, each DC biasing circuit operational to provide a DC bias source for a single RF input stage;

a cascade of radio frequency (RF) input stages, wherein each RF input stage includes a passively tuned RF input circuit biased via a single DC biasing circuit selected from within the plurality of DC biasing circuits; and a sole tunable RF output stage including at least one adjustable inductor, wherein the sole tunable RF output stage operates via the at least one adjustable inductor to tune filtered RF input signals generated via the cascade of RF input stages such that the LNA operates over multiple frequency bands without use of external input switches and further without use of external output switches.

According to still another embodiment of the present invention, a method of operating a low noise amplifier (LNA) comprises the steps of:

providing an LNA having a means for passively filtering a plurality of radio frequency (RF) input signals; and operating the LNA over multiple frequency bands without use of external switches.

According to still another embodiment of the present invention, a low noise amplifier (LNA) comprises:

at least one radio frequency (RF) input stage; and a sole tunable RF output stage comprising:

at least one adjustable inductor; and an adjustable capacitor bank, wherein the at least one adjustable inductor and the adjustable capacitor bank together operate to tune signals passing through the at least one RF input stage to a single RF output node such that the LNA operates over multiple frequency bands without use of RF output stage switches.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1A:
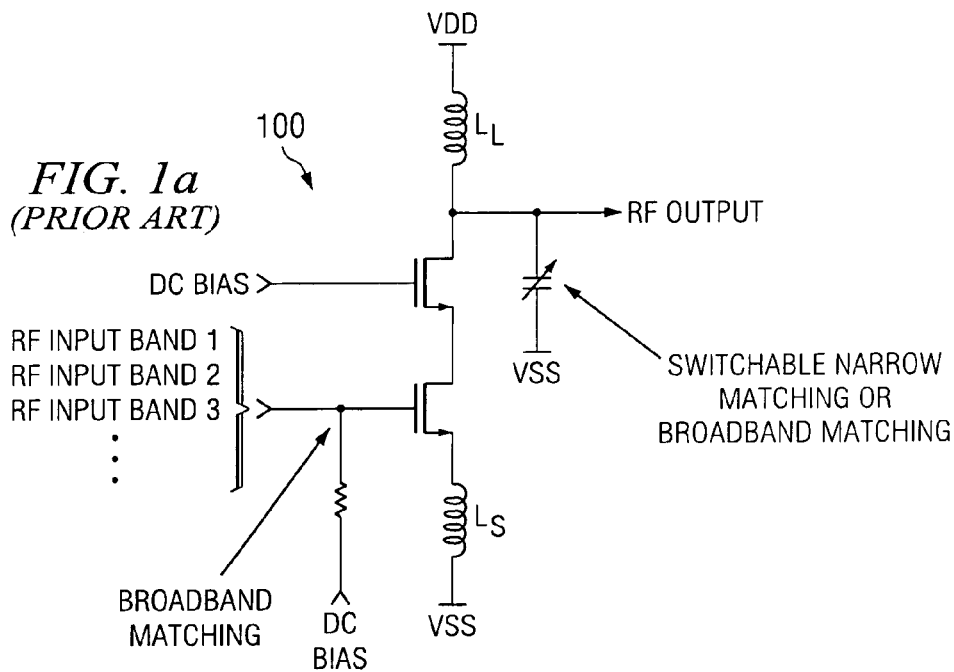
FIG. 1(a) is a schematic diagram illustrating a prior art multi-band LNA that includes a single input and broadband matching at the input and output.
Figure 1B:
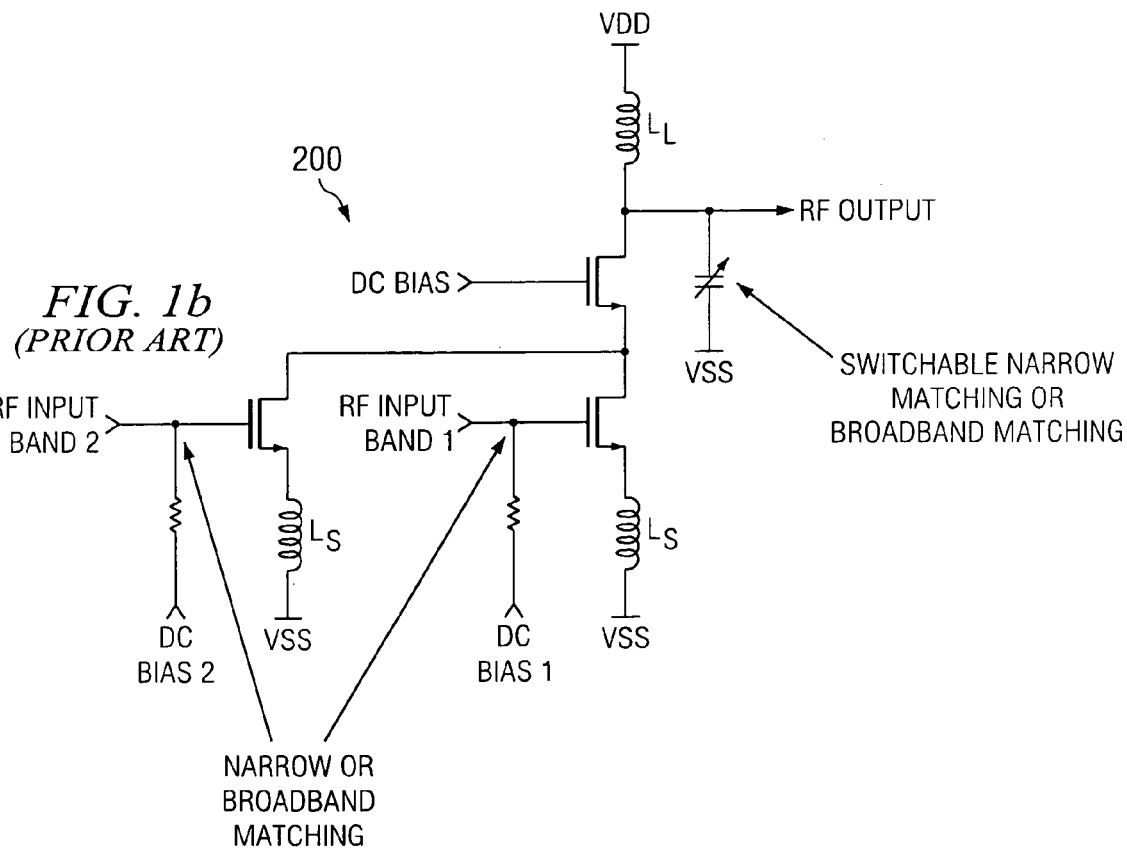
FIG. 1(b) is a schematic diagram showing a prior art multi-band LNA that employs multiple input transistors.
Figure 2A:
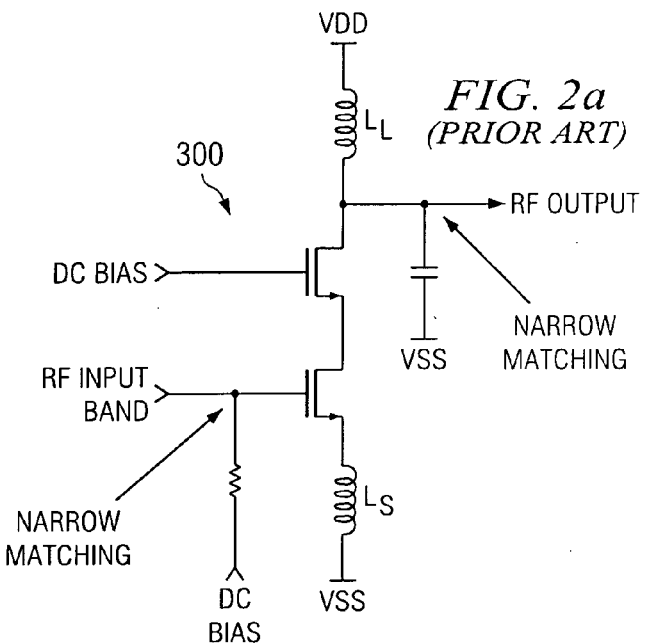
FIG. 2(a) is a schematic diagram illustrating a prior art single (narrow)-band LNA.
Figure 2B:
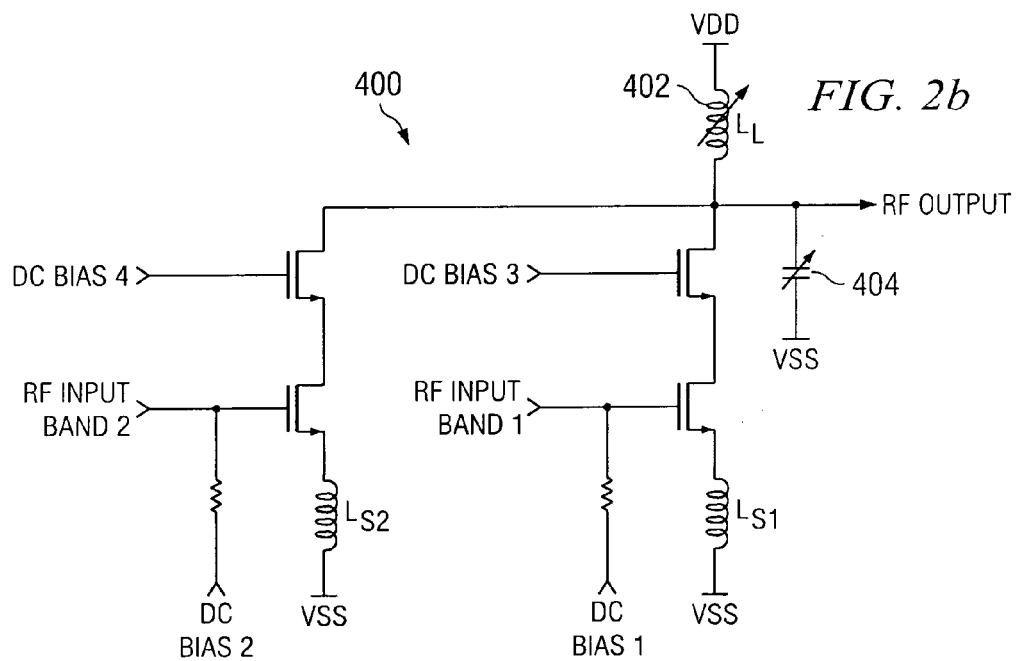
FIG. 2(b) is a schematic diagram illustrating a multi-band LNA architecture according to one embodiment of the present invention.
Figure 4:
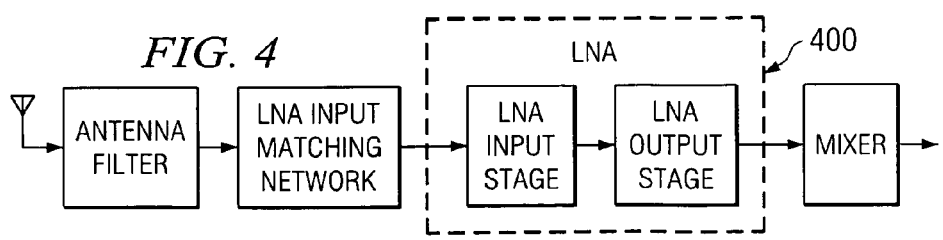
FIG. 4 is a block diagram illustrating the signal flow through the LNA depicted in FIG. 2(b) and FIG. 3.

FIG. 2(a) illustrates a typical prior art single (narrow)-band LNA 300, while FIG. 2(b) illustrates a multi-band LNA circuit topology 400 according to one embodiment of the present invention. The circuit topology 400 can be easily extended to a differential LNA that will be discussed herein below in further detail following a detailed discussion of the circuit topology 400. FIG. 4 is a block diagram illustrating the signal flow through the LNA 400 depicted in FIG. 2(b), and is provided to enhance clarity and understanding of the embodiments described herein below.

The single (narrow)-band LNA 300 typically is employed on a PCB having separate antenna filters providing individual outputs for each frequency band. An individual input bondpad thus receives only one signal from one filter, which is then amplified without interfering with other signals. The source degeneration inductors, $L_{sn}$, where n is an integer, seen in FIG. 2(b) can be reduced to 1, depending upon the circuit performance requirement. If only $L_{s1}$ is employed, it can be made tunable when necessary as will be discussed herein below for the load inductor $L_L$ (i.e. source nodes of M1, M3, can be shorted if desired). Any unused branches can be powered-down simply by pulling the DC biases to 0V via any suitable power-down circuitry. The isolation between an active branch and one of the inactive branches is the typical LNA S12 (better than 40 dB) of the active branch plus better than 30 dB from the inactive branch, resulting in a total isolation of greater than 70 dB.

With continued reference to FIG. 2(b), output matching is accomplished by an adjustable inductor 402 together with a tunable capacitor bank 404. The adjustable inductor 402 can be implemented in various ways such as by using the technique disclosed by Seong-Mo Yim and Kenneth, K. O., "Demonstration of a switched resonator concept in a dual-band monolithic CMOS LC-tuned VCO," *IEEE Conference of Custom Integrated Circuits*, pp. 205–208, May 2001, of using a switch to short a section of the inductor metal winding, or by using a magnetic coupling to increase/decrease the effective inductance, or by using a combination of the two approaches, as stated herein before. The inductance 402 can for example, be adjusted higher (with positive mutual inductance) and lower (with negative mutual inductance) than that of the nominal (un-adjusted) inductance.

Figure 3:
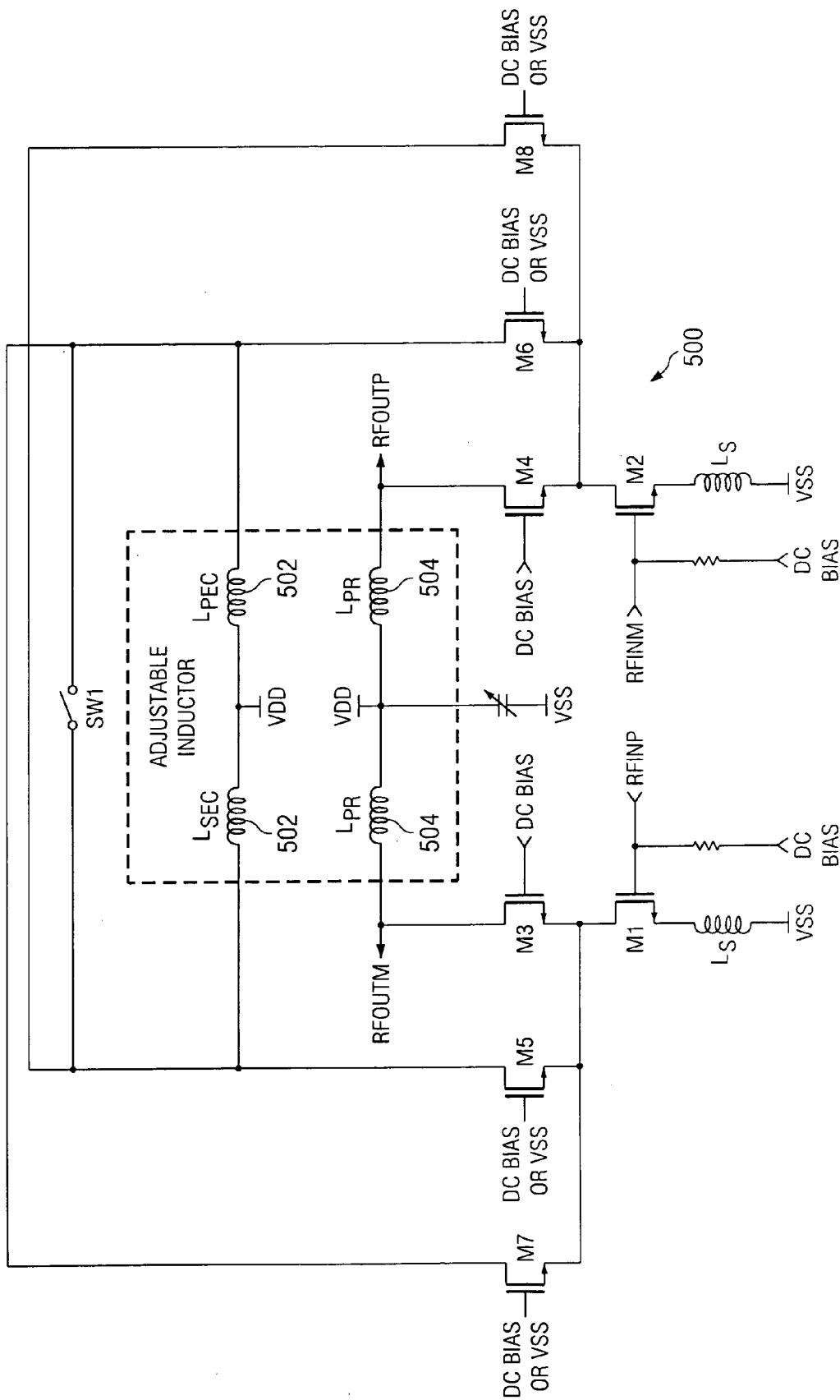
FIG. 3 is a schematic diagram illustrating a differential LNA topology using the multi-band LNA architecture shown in FIG. 2(b) according to one embodiment of the present invention.

FIG. 3 is a schematic diagram illustrating a differential LNA topology 500 using the multi-band LNA architecture 400 shown in FIG. 2(b) according to one embodiment of the present invention. The LNA topology 500 is described herein below to facilitate a better understanding for one application of the foregoing positive and negative mutual inductance. When turning on M5 and M6 by switching the gates of M5 and M6 from VSS to a DC bias, and if the layout was implemented such that the secondary inductor 502 has a current flowing in the same direction as that in the outer turn metal of the primary inductor 504, then the mutual inductance is positive resulting in an increase of inductance seen at RFOUTP and RFOUTM, lowering the tuned frequency of the output matching network. Similarly, when turning on M7 and M8, the mutual inductance would be negative resulting in a decrease of inductance seen at RFOUTP and RFOUTM, increasing the tuned frequency of the output matching network. Those skilled in the filter art will readily appreciate that M5/6 and M7/8 can be implemented using programmable bits allowing various current magnitudes to flow in the secondary inductor 502 to provide multiple frequency tuning steps. Further, a negative mutual inductance can be implemented simply by closing the switch SW1 such that the primary inductor 504 will have less effective inductance according to Lenz's law.

In summation, a low noise amplifier circuit topology 400 that operates over multiple frequency bands while occupying less silicon area than a conventional LNA architecture has been described. The LNA topology 400 requires no external input stage or output stage switches, thereby eliminating the additional insertion loss and noise figure. The LNA topology 400 preserves the filtering/rejection to interferers associated with conventional LNAs while relaxing linearity requirements in a deep-submicron low-voltage CMOS process. Finally the LNA topology 400 provides improved isolation between multiple input signals allows use of presently available antenna filters and allows all desired frequency bands to function with a single PCB in its ON state.

In view of the above, it can be seen the present invention presents a significant advancement in the art of low noise amplifier design. This invention has been described in considerable detail in order to provide those skilled in the LNA art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A low noise amplifier (LNA) comprising:
  a plurality of DC biasing circuits, each DC biasing circuit operational to provide a DC bias source for a single RF input stage and to increase isolation from other input stages;
  a cascade of radio frequency (RF) input stages, wherein each RF input stage includes a passively tuned RF input circuit biased via a single DC biasing circuit selected from within the plurality of DC biasing circuits; and
  a sole RF output node associated with the cascade of RF input stages and the plurality of DC biasing circuits, wherein the LNA operates over multiple frequency bands without use of external switches.

2. A low noise amplifier (LNA) comprising:
  means for filtering a plurality of radio frequency (RF) input signals; and
  means for tuning the plurality of filtered RF input signals at a sole common RF output node such that the LNA operates over multiple frequency bands without use of external input switches and further without use of external output switches.

3. The LNA according to claim 2, wherein the means for filtering a plurality of RF input signals comprises:
  a plurality of RF input transistors, each having a source/emitter node, a gate/base node and a drain/collector node;
  a DC bias switch associated with each RF input transistor and configured to selectively couple and decouple the associated RF input transistor drain/collector node to the tuning means;
  an RF inductor associated with each RF input transistor and configured to couple the associated RF transistor source/emitter node to a steady state voltage; and
  a DC bias resistor associated with each RF input transistor and configured to couple the associated RF transistor to a DC bias source.

4. The LNA according to claim 3, wherein each DC bias switch comprises a transistor selectively activated via a DC bias source.

5. The LNA according to claim 2, wherein the filtering means and the tuning means together are configured as a differential LNA.

6. The LNA according to claim 2, wherein the filtering means comprises:
  a plurality of DC biasing circuits, each DC biasing circuit operational to provide a DC bias source for a single RF input stage and to increase isolation from other input stages; and
  a cascade of radio frequency (RF) input stages, wherein each RF input stage includes a passively tuned RF input circuit biased via a single DC biasing circuit selected from within the plurality of DC biasing circuits.

7. The LNA according to claim 2, wherein the means for tuning the plurality of filtered RF input signals comprises a sole tunable RF output stage including at least one adjustable inductor, wherein the sole tunable RF output stage operates via the at least one adjustable inductor to tune the filtered RF input signals such that the LNA operates over multiple frequency bands without use of external input switches and further without use of external output switches.

8. The LNA according to claim 2, wherein the means for tuning the plurality of filtered RF input signals comprises a sole tunable RF output stage including at least one adjustable capacitor bank, wherein the sole tunable RF output stage operates via the at least one adjustable capacitor bank to tune the filtered RF input signals such that the LNA operates over multiple frequency bands without use of external input switches and further without use of external output switches.

9. A low noise amplifier (LNA) comprising a sole tunable RF output stage including at least one adjustable inductor, wherein the sole tunable RF output stage operates via the at least one adjustable inductor to tune filtered RF input signals such that the LNA operates over multiple frequency bands without use of external input switches and further without use of external output switches.

10. A low noise amplifier (LNA) comprising:
  a plurality of DC biasing circuits, each DC biasing circuit operational to provide a DC bias source for a single RF input stage and to increase isolation from other input stages;
  a cascade of radio frequency (RF) input stages, wherein each RF input stage includes a passively tuned RF input circuit biased via a single DC biasing circuit selected from within the plurality of DC biasing circuits; and
  a sole tunable RF output stage including at least one adjustable inductor, wherein the sole tunable RF output stage operates via the at least one adjustable inductor to tune filtered RF input signals generated via the cascade of RF input stages such that the LNA operates over multiple frequency bands without use of external input switches and further without use of external output switches.

11. A method of operating a low noise amplifier (LNA), the method comprising the steps of:
  providing an LNA having a means for passively filtering a plurality of radio frequency (RF) input signals; and operating the LNA over multiple frequency bands without use of external switches.

12. The method according to claim 11, wherein the step of operating the LNA over multiple frequency bands without use of external switches comprises the steps of:
   activating a desired passive filter for each RF input signal frequency; and
   passing each RF input signal within the multiple frequency bands through its respective passive filter to a sole common RF output node.

13. The method according to claim 12, further comprising the steps of:
   passing the filtered RF input signals through a sole RF tuning network comprising at least one adjustable inductor; and
   adjusting the at least one adjustable inductor to tune the filtered RF input signals such that the LNA operates over multiple frequency bands without use of external input switches and further without use of external output switches.

14. A low noise amplifier (LNA) comprising:
   at least one radio frequency (RF) input stage; and
   a sole tunable RF output stage comprising:
      at least one adjustable inductor; and
      an adjustable capacitor bank, wherein the at least one adjustable inductor and the adjustable capacitor bank together operate to tune signals passing through the at least one RF input stage to a single RF output node such that the LNA operates over multiple frequency bands without use of RF output stage switches.

15. The LNA according to claim 14, further comprising means for DC biasing each at least one RF input stage, such that said each at least one RF input stage is selectively turned on and off.

16. The LNA according to claim 14, wherein the at least one RF input stage and the sole tunable RF output stage are together configured as a differential LNA.

17. The LNA according to claim 14, wherein the at least one adjustable inductor comprises:
   at least one primary inductor; and
   at least one adjustable secondary inductor, wherein the at least one primary inductor and the at least one adjustable secondary inductor are together configured to selectively increase or decrease the tuned frequency of the sole tunable RF output stage.

18. The LNA according to claim 15, wherein the at least one RF input stage comprises:
   at least one RF input transistor having a source/emitter, gate/base and drain/collector;
   a DC bias switch associated with the at least one RF input transistor and configured to selectively couple and decouple the associated RF input transistor drain/collector to the sole tunable RF output stage;
   an RF inductor associated with the at least one RF input transistor and configured to couple the associated RF transistor source/emitter to a steady state voltage; and
   a DC bias resistor associated with the at least one RF input transistor and configured to couple the associated RF transistor gate/base to a DC bias source.

19. The LNA according to claim 18, wherein the DC bias switch comprises a transistor selectively activated via a DC bias source.

20. The LNA according to claim 14, wherein the at least one RF input stage and the sole tunable RF output stage together are configured as a differential LNA.

21. The LNA according to claim 20, wherein the at least one adjustable inductor comprises:
   a primary inductor; and
   an adjustable secondary inductor, wherein the primary inductor and the adjustable secondary inductor are together configured to selectively increase or decrease the tuned frequency of the sole tunable RF output stage.

* * * * *